United States Patent [19]
Chuang

[11] Patent Number: 5,981,337
[45] Date of Patent: Nov. 9, 1999

[54] METHOD OF FABRICATING STACK CAPACITOR

[75] Inventor: Shu-Ya Chuang, Hsinchu Hsien, Taiwan

[73] Assignee: United Semiconductor Corp., Hsin-Chu, Taiwan

[21] Appl. No.: 09/070,374

[22] Filed: Apr. 30, 1998

[30] Foreign Application Priority Data

Mar. 20, 1998 [TW] Taiwan ................................. 87104163

[51] Int. Cl.$^6$ .............................................. H01L 21/8242
[52] U.S. Cl. .......................... 438/253; 438/398; 438/255
[58] Field of Search .................................... 438/396, 253, 438/254, 255, 397, 398

[56] References Cited

U.S. PATENT DOCUMENTS

| | | | |
|---|---|---|---|
| 5,399,518 | 3/1995 | Sim et al. | 438/396 |
| 5,438,013 | 8/1995 | Kim et al. | 438/396 |
| 5,447,881 | 9/1995 | Ryou | 438/396 |
| 5,516,719 | 5/1996 | Ryou | 438/396 |

*Primary Examiner*—Tuan H. Nguyen
*Attorney, Agent, or Firm*—Christie, Parker & Hale, LLP

[57] ABSTRACT

A method of fabricating a stack capacitor. Using self-aligned method by the formation of spacers on the poly-silicon layer, a stack capacitor is formed by using photo-lithography and etching only once.

26 Claims, 8 Drawing Sheets

METHOD OF FABRICATING STACK CAPACITOR

CROSS-REFERENCE TO RELATED APPLICATION

This application claims priority benefit of Taiwan application Serial no. 87104163, filed Mar. 20, 1998, the full disclosure of which is incorporated herein by reference.

BACKGROUND OF THE INVENTION

1. Field of the Invention

The invention relates to a method of fabricating an dynamic random access memory (DRAM), and more particularly to a method of fabricating a capacitor with a higher capacitance in a DRAM, by increasing surface area of an electrode.

2. Description of the Related Art

Figure 1:
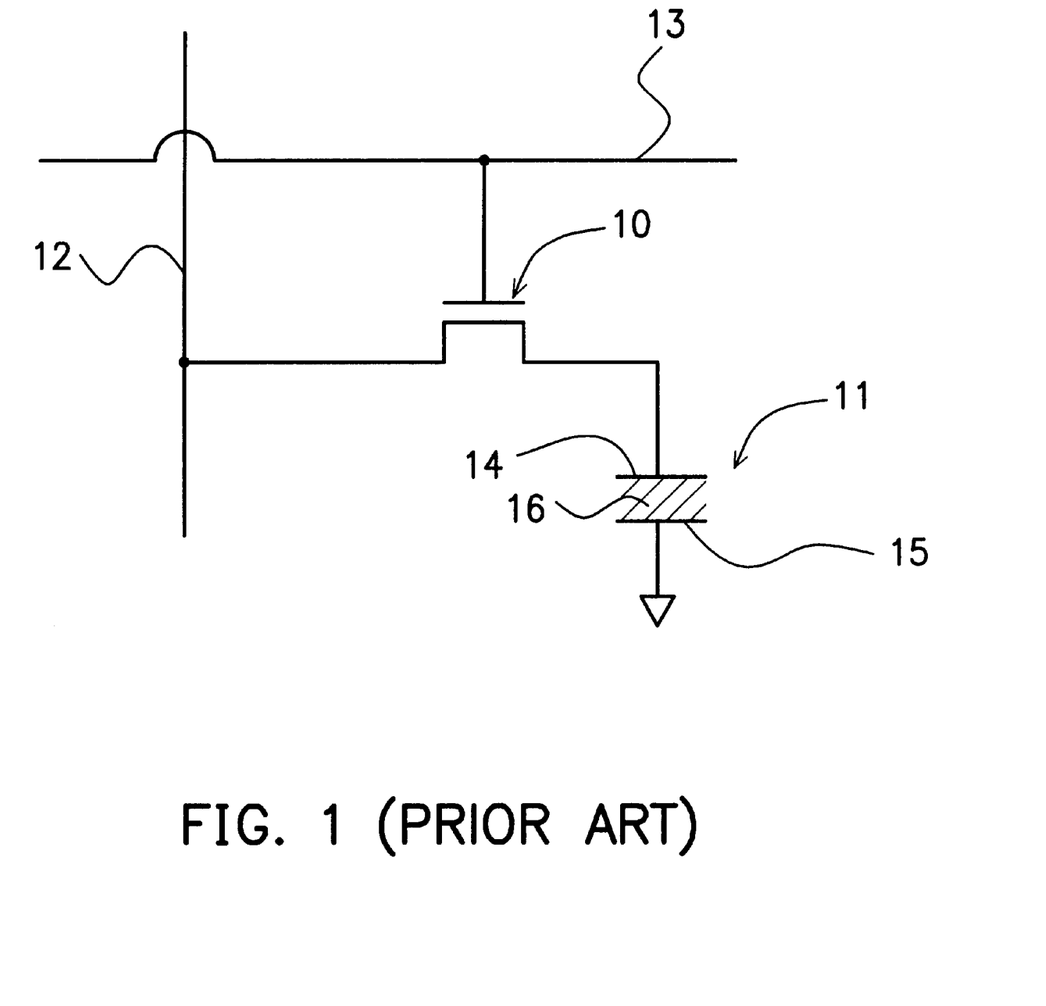
FIG. 1 shows a circuit diagram of a conventional DRAM.

As the function of a microprocessor becomes more and more powerful, the program and calculation of a software becomes more and more complicated, and thus, the required capacitance of a memory is larger and larger. FIG. 1 shows a circuit diagram of a conventional DRAM. A memory cell comprises a transfer transistor 10 and a storing capacitor 11. The source region of the transfer transistor 10 is coupled with a corresponding bit line 12, whereas the gate is coupled with a corresponding word line 13. The drain region of the transfer transistor 10 electrically connects with the storing electrode 14, that is, the bottom electrode of the capacitor 11. The plate electrode 15, that is, the top electrode or the cell electrode, connects with a constant voltage source. A dielectric layer 16 is formed between the storing electrode and the plate electrode.

The capacitor is the heart for storing input signal in a DRAM. For a large amount of charges to be stored in a capacitor, it is more frequent that an soft error is caused by noise, such as an α particle, during data access, and therefore, the refresh frequency is reduced. Several ways are available to increase the storing capacitance of a capacitor. (1) Using a dielectric layer with a higher dielectric constant, the storing charge per unit area is increased. (2) To decrease the thickness of the dielectric layer, a higher capacitance can be obtained. However, the quality of the dielectric layer restricts the thickness of the dielectric layer to a certain value. (3) By increasing the surface area of a capacitor, the amount of charges stored in a capacitor is increased. However, with increasing the surface area of a capacitor, the integration of a device is decreased.

For a conventional DRAM with a smaller amount of storing charges, a two dimensional planar type capacitor is adapted in a integrated circuit. The planar type capacitor occupies a sizeable surface area on the substrate, and therefore, not suitable for the use in a high integrated circuit. To achieve a high integration, a three dimensional structure of a capacitor, such as a stacked type or a trench type capacitor is adapted. However, as the integration becomes further higher, a pure three dimensional capacitor can not meet the requirement to be used. A method of increasing capacitance in a small area of a capacitor in a DRAM is developed.

Figure 2A:
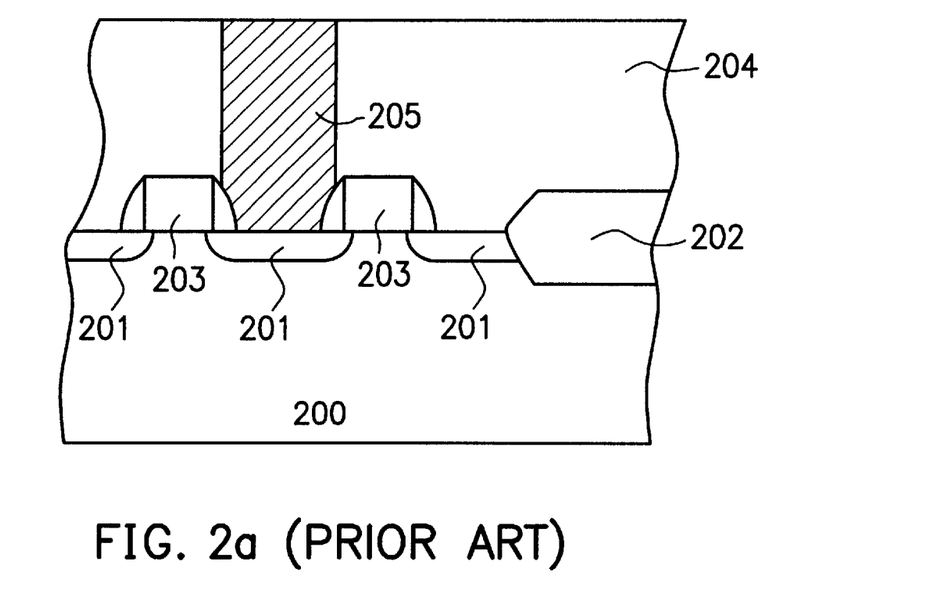
Figure 2B:
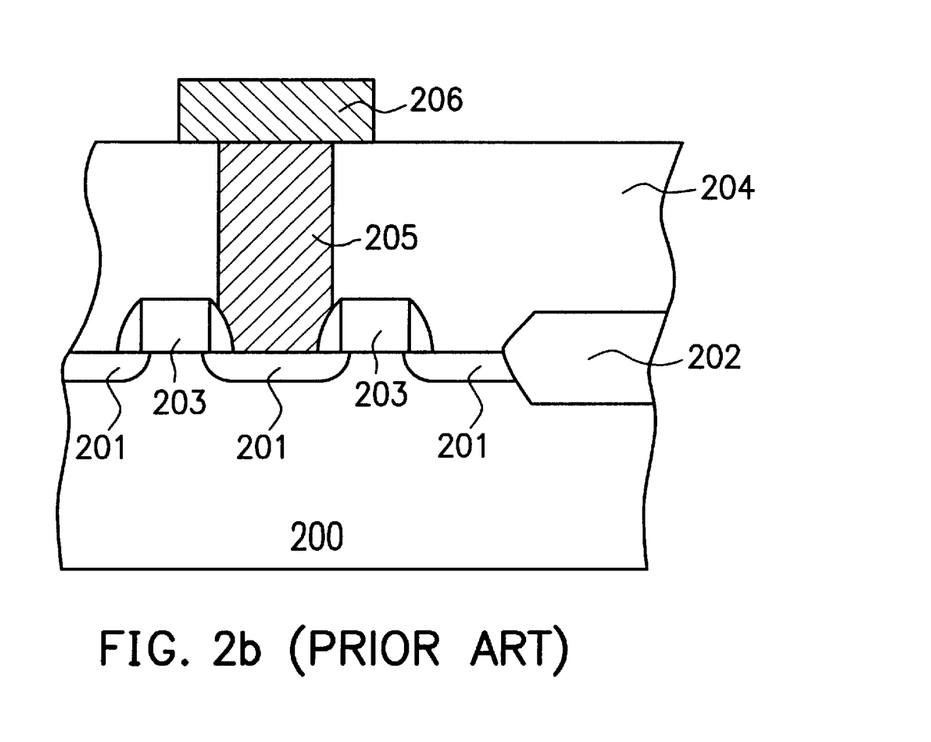
Figure 2C:
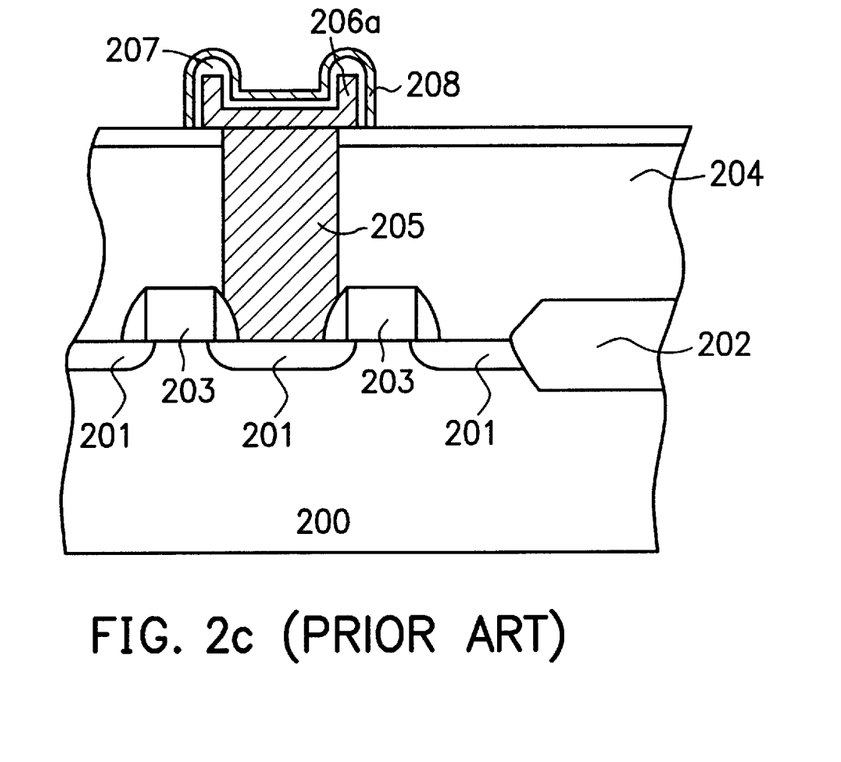

Referring to FIG. 2a to FIG. 2c, a conventional method of fabricating a stack capacitor in a DRAM is shown. Referring to FIG. 2a, on a semiconductor substrate 200, a metal-oxide semiconductor (MOS) comprising a source/drain region 201, a gate 203, a field oxide layer 202, a oxide layer 204, and a poly-via 205 are formed. The poly-via 205 penetrates through the oxide layer 204 to electrically connects the source/drain region 201 of the MOS.

Referring to FIG. 2b, a poly-silicon layer 206 is formed on the oxide layer 206, for example, by using chemical vapour deposition (CVD). The poly-silicon layer 206 is then defined by photo-lithography and etching as shown in the figure.

Referring to FIG. 2c, using photo-lithography and etching, the poly-silicon layer 206 is further defined to formed as a bottom electrode 206a. On the bottom electrode 206a, a dielectric layer 207 and a top electrode are formed sequentially to complete a stack capacitor structure in a DRAM.

Figure 3:
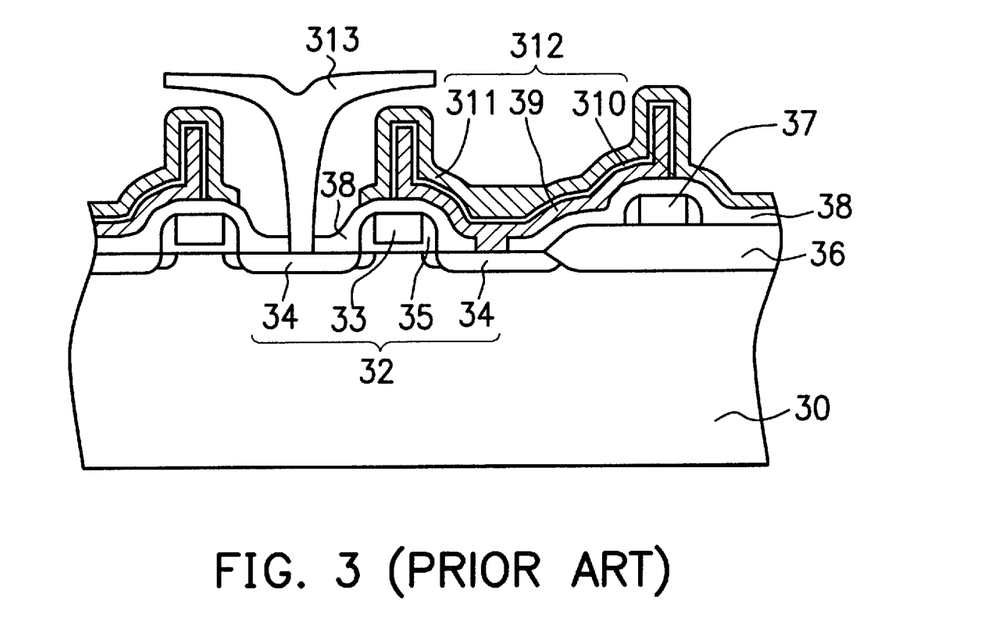
FIG. 3 is a cross sectional view of a conventional stacked type capacitor in a DRAM.

Referring to FIG. 3, a stacked type capacitor of a DRAM is shown. A semiconductor substrate 30 comprising a MOS transistor 32 which includes a gate 33, a source/drain region 34 and a spacer 35, a field oxide layer 36, and a conductive layer 37 is provided. An insulation layer 38 is formed and patterned over the substrate 30, so that a contact window is formed to expose the source/drain region 34. A bottom electrode 39, a dielectric layer 310, and a top electrode 311 is formed within and on the contact window in sequence to complete the stacked type capacitor 312. The dielectric layer 310 includes a nitride/oxide layer (ON) or an oxide/nitride/oxide (ONO) layer. The bottom electrode 39 and the top electrode 311 include poly-silicon layer. The bottom electrode 39 includes a ragged structure. After the process of forming metal contact and insulation passivation layers, the formation of a DRAM is completed.

In the conventional method of fabricating a capacitor of a DRAM, by improving the topography of a capacitor, for example, forming a ragged surface, the capacitance is increased. However, the increase of capacitance is not enough to meet the requirement of a further smaller devices. In addition, the fabrication process is complex for the conventional method. For example, in the above method, two steps of photolithography and etching steps are in use. Therefore, the possibility of causing a misalignment and an error during exposure is increased. The reliability of device is lowered, the device is degraded, and the production cost is increased.

SUMMARY OF THE INVENTION

It is therefore an object of the invention to provide a method of fabricating a stack capacitor in a DRAM. The surface area of a capacitor is increased by a stack structure and an hemispherical grain surface to obtain a higher capacitance. The capacitor can be applied to a device with a further smaller dimension.

It is therefore another object of the invention to provide a method of fabricating a stack capacitor in a DRAM. During the formation of the capacitor, by self-align method, only once the photolithography is in use. The fabrication process is thus simplified. In addition, the possibility of causing a misalignment and an error is decreased. The reliability of device is enhanced, and the production cost decreased.

To achieve these objects and advantages, and in accordance with the purpose of the invention, as embodied and broadly described herein, the invention is directed towards a method of fabricating a stack capacitor. A semiconductor substrate comprising a transistor having a gate and a source/drain region, a field oxide layer, an oxide layer covering the whole semiconductor substrate, and a poly-via penetrating through the first oxide layer to electrically connect the source/drain region is provided. A poly-silicon layer is formed and patterned to cover the whole poly-via and a part of the first oxide layer. A hemispherical grain silicon layer is formed over the substrate. A first spacer is formed on the hemispherical grain silicon layer on a side wall of the poly-silicon layer. The hemispherical grain silicon on the oxide layer and a part of the poly-silicon layer are removed by using the first spacer as a mask, so that the poly-silicon layer having a lower surface level than the first spacer. A second spacer is formed to embrace the first spacer, so that a part of the poly-silicon layer is covered by the second spacer. A part of the exposed poly-silicon layer by using the first and second spacers as a mask to form a bottom electrode. The first spacer and the second spacer are removed. A dielectric layer to cover the bottom electrode. A top electrode is formed on the dielectric layer.

It is to be understood that both the foregoing general description and the following detailed description are exemplary and explanatory only and are not restrictive of the invention, as claimed.

BRIEF DESCRIPTION OF THE DRAWINGS

FIG. 2a to FIG. 2d show a conventional method of fabricating a stack capacitor in a DRAM;

DESCRIPTION OF THE PREFERRED EMBODIMENTS

In FIG. 4a to FIG. 4g, a preferred embodiment of fabricating a cylindrical capacitor according to the invention is shown.

Figure 4A:
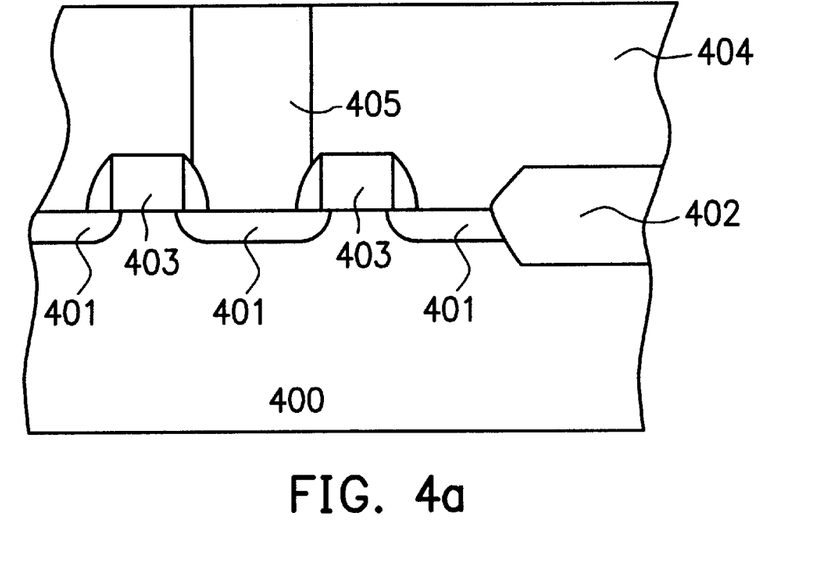
FIG. 4a to FIG. 4g show the cross sectional views of the process of fabricating a stack capacitor in a DRAM in a preferred embodiment according to the invention.

Referring to FIG. 4a, a semiconductor substrate 400 is provided. The semiconductor substrate 400 comprises a MOS which includes a gate 403 and a source/drain region 401, a field oxide layer 402, a first oxide layer 404, and a poly-via 405. The poly-via penetrates through the first oxide layer 404 to electrically connect the source/drain region 401 of the MOS.

Figure 4B:
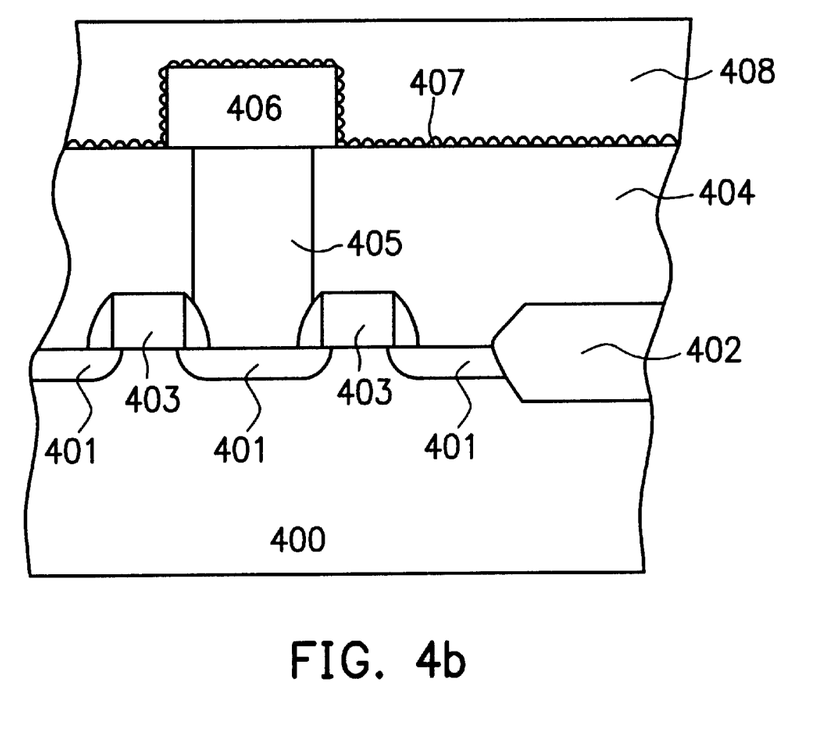
Figure 4C:
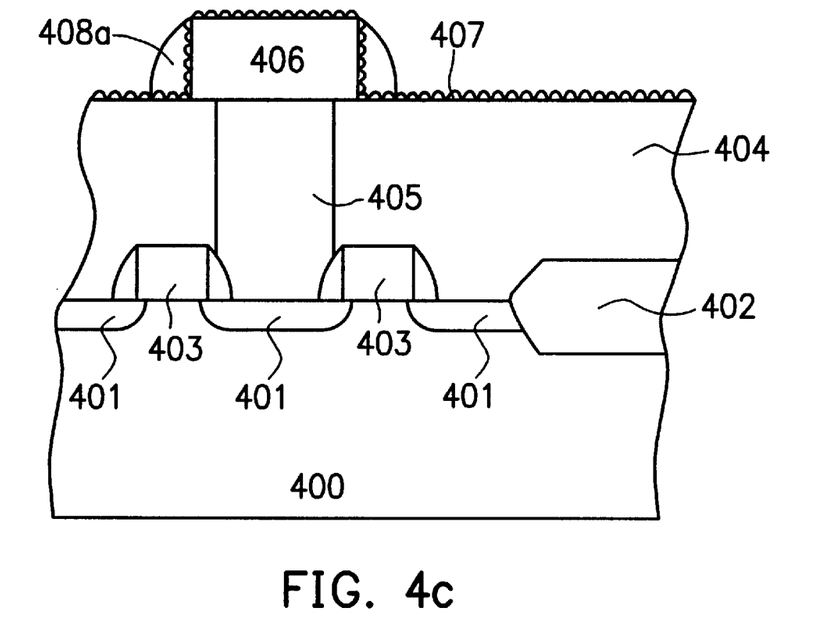

Referring FIG. 4b, on the first oxide layer 404 and the poly-via 405, a poly-silicon layer 406 is formed, for example, a silicon oxide layer formed by chemical vapour deposition. The poly-silicon layer 406 is then defined by photo-lithography and etching to cover the whole poly-via 405, so that most of the first oxide layer 404 is exposed. Over the semiconductor 400, a hemispherical grain silicon layer (HSG-Si) 407 is formed, for example, by using chemical vapour deposition. On the HSG-Si 407, a second oxide layer 408 is formed, for example, by chemical vapour deposition. The second oxide layer 408 is then etched back to form a first spacer 408a on the HSG-Si layer 407 on the side wall of the poly-silicon layer 406, as shown in FIG. 4c.

Figure 4D:
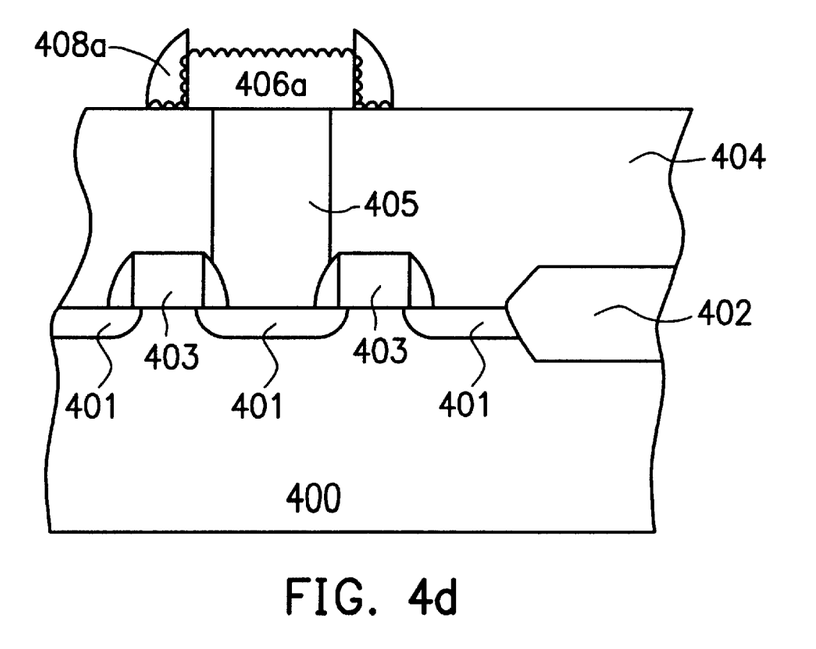

Referring to FIG. 4d, using wet etching to remove HSG-Si layer 407 on the first oxide layer 404. It is to be noted that while removing the HSG-Si layer 407 on the first oxide layer 404, the poly-silicon layer 406 itself and the HSG-Si layer 407 thereon are removed simultaneously. While the HSG-Si layer 407 on the side wall of the polysilicon layer 406 is covered and protected by the first spacer 408a without being removed. The resultant structure of the poly-silicon layer 406a is shown as fiigure.

Figure 4E:
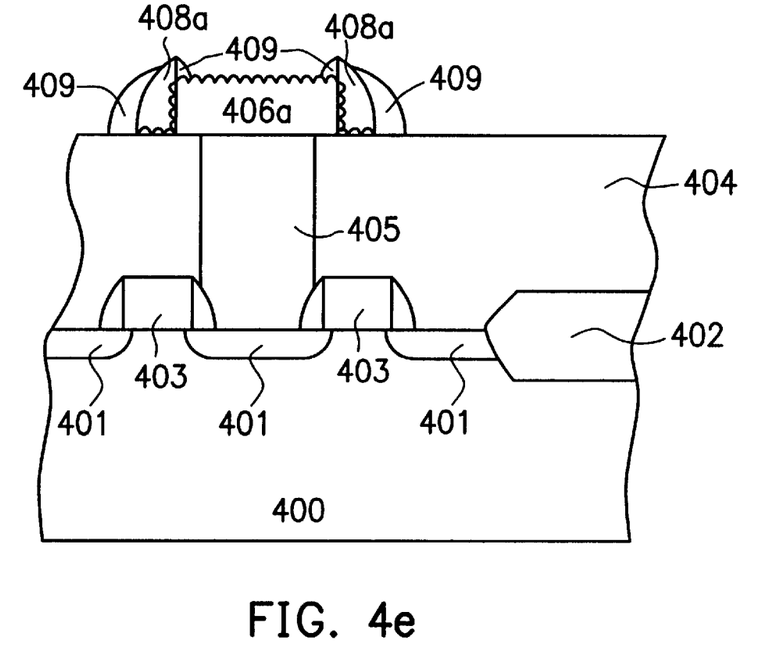

Referring to FIG. 4e, a third oxide layer (not shown) is formed and etched back over the substrate 400. As shown in the figure, a second spacer 409 of oxide layer is formed on the first spacer 408a.

Figure 4F:
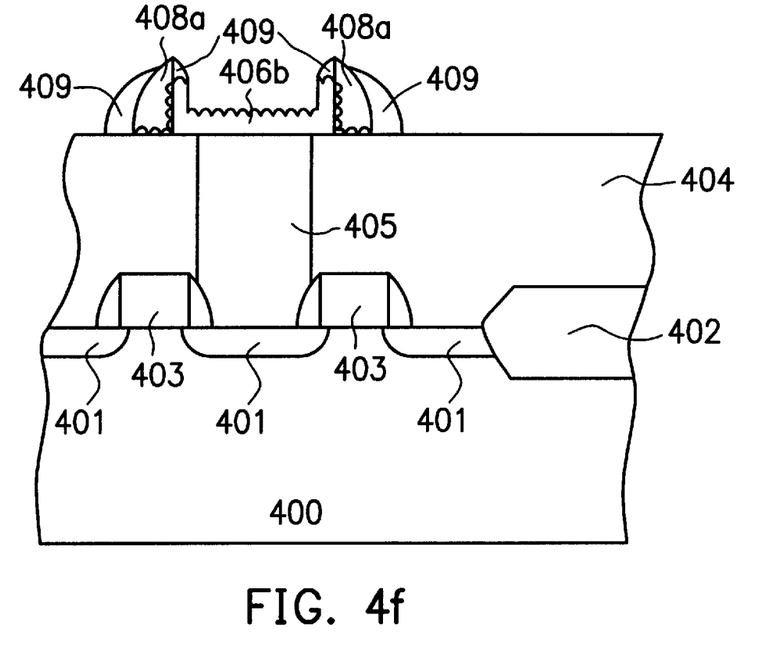

Referring to FIG. 4f, using the first spacer 408a and the second spacer 409 as masks, the poly-silicon layer 406a is etched to form a bottom electrode 406b.

Figure 4G:
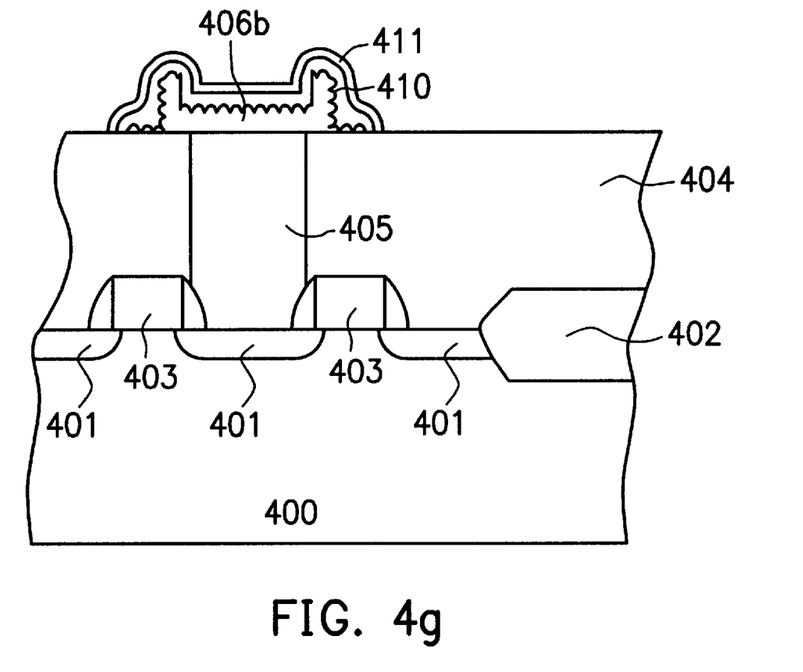

Referring to FIG. 4g, by using a conventional fabricating process, a dielectric layer 410 and a top electrode 411 are formed on the bottom electrode 406b in sequence.

In addition to fabricate a stack capacitor by applying self-aligned method as mentioned above, the surface area of the stack capacitor can be further enlarged layer according to the invention. A detail description is shown in FIG. 5a to FIG. 5c and given as follows.

Figure 5A:
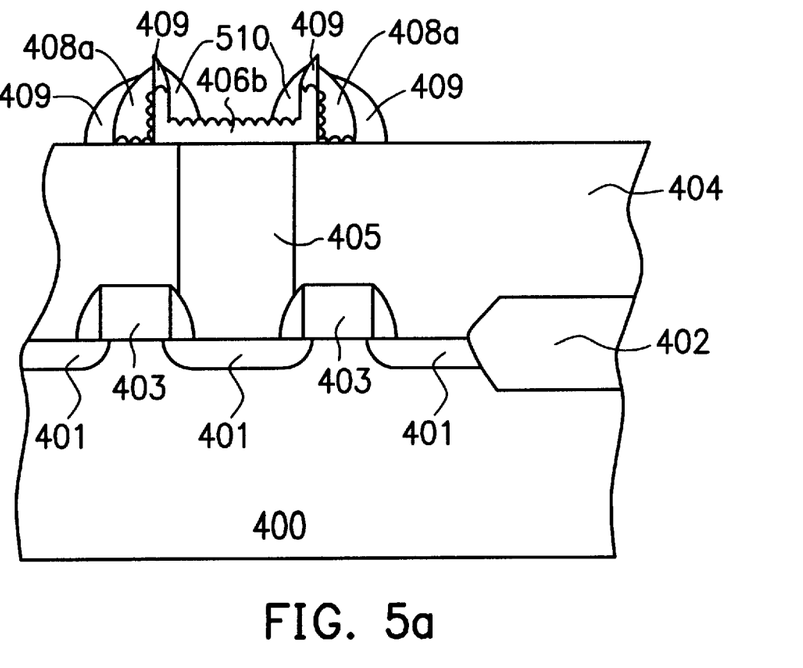
FIG. 5a to FIG. 5c show the cross sectional view of further performing self-aligned method on the stack capacitor shown as FIG. 4a to FIG. 4c.

Referring to FIG. 5a, providing the structure shown in FIG. 4f. On the whole structure, a fourth oxide layer (not shown) is formed and etched to form a third spacer 510 on the inner side wall of the bottom electrode 406b, so that a part of the inner surface of the bottom electrode 406b is exposed.

Figure 5B:
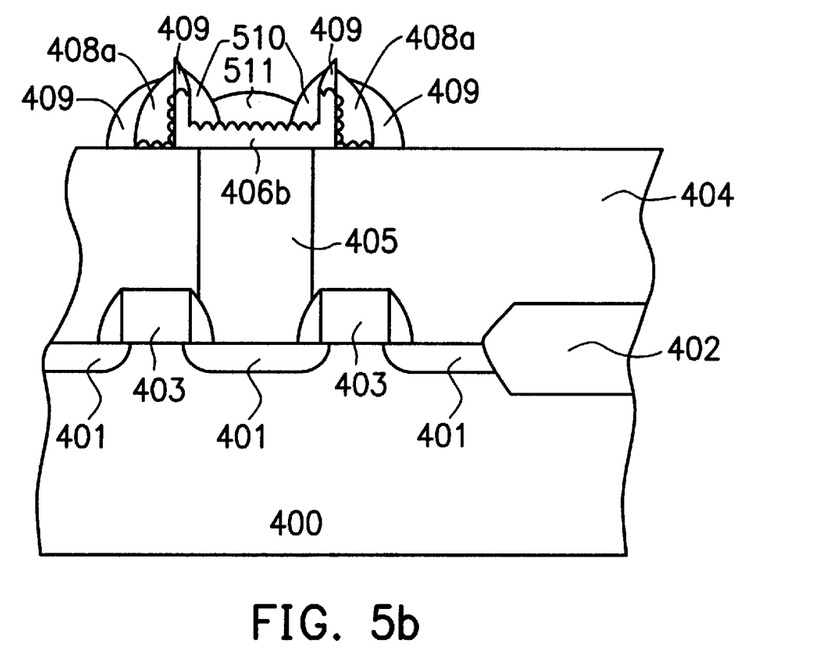

Referring to FIG. 5b, a poly-silicon layer (not shown) is formed and etched, so that a poly-silicon column 511 is formed on the exposed bottom electrode 406b. The poly-silicon column 511 and the bottom electrode 406b are then combined to function as a new bottom electrode 512. Using wet etching, for example, dip by hydrogen fluoride (HF), the first spacer 408a, the second spacer 409, and the third spacer 510 are removed.

Figure 5C:
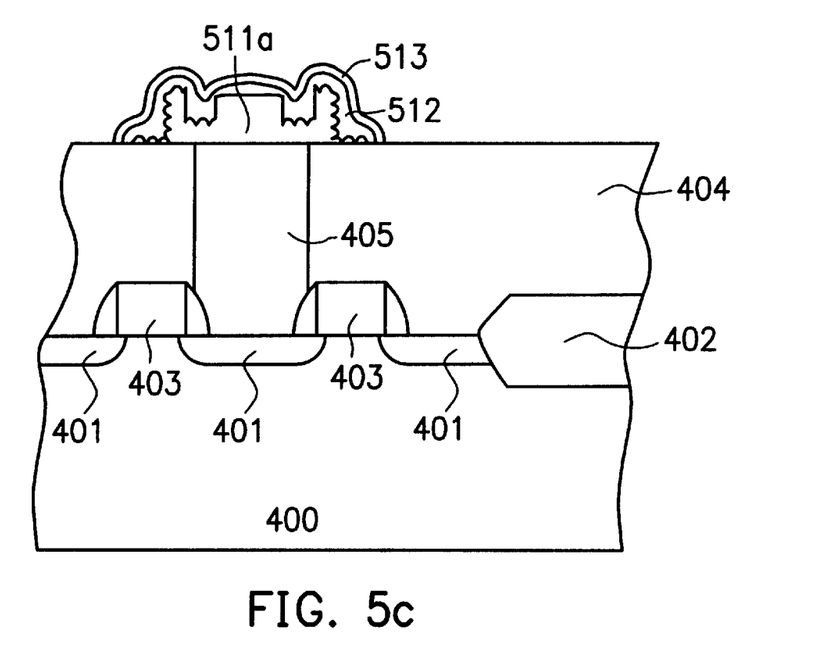

Referring to FIG. 5c, using a conventional fabricating process, a dielectric layer 512 and a top electrode 513 are formed on the bottom electrode 511 a in sequence.

It is therefore a characteristic of the invention that using self-aligned method by the formation of spacers, a method of fabricating a stack capacitor in a DRAM is provided. In addition, by stack topography and the formation of an HSG-Si layer of the bottom electrode, the surface area is enlarged. Consequently, the capacitance is increased effectively. The method is applicable in a further smaller devide.

Furthermore, by using self-aligned method, only one step of photolithography is used. The fabricating process is simplified, and the production cost is decreased. The possibility of causing a misalignment and an error during exposure is decreased, so that the reliability of device is enhanced.

Other embodiment of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating a stack capacitor, wherein a semiconductor substrate comprising a transistor having a gate and a source/drain region, a first oxide layer covering the whole semiconductor substrate, and a poly-via penetrating through the first oxide layer to electrically connect the source/drain region is provided, comprising:

forming and patterning a poly-silicon layer to cover the whole poly-via and a part of the first oxide layer;

forming a first spacer on a side wall of the poly-silicon layer;

removing a part of the poly-silicon layer, so that the poly-silicon layer having a lower surface level than the first spacer;

forming a second spacer to embrace the first spacer, so that a part of the poly-silicon layer is covered by the second spacer;

removing a part of the exposed poly-silicon layer by using the first and the second spacers as a mask to form a bottom electrode;

removing the first spacer and the second spacer; forming a dielectric layer to cover the bottom electrode; and forming a top electrode on the dielectric layer.

2. The method according to claim 1, wherein the poly-via comprises a plug.

3. The method according to claim 1, wherein the first spacer comprises an oxide layer.

4. The method according to claim 1, wherein the second spacer comprises an oxide layer.

5. The method according to claim 3 or 4, wherein the first and the second spacers are removed by wet etching using hydrogen fluoride to dip.

6. The method according to claim 1, wherein the top electrode comprises a poly-silicon layer.

7. A method of fabricating a stack capacitor, wherein a semiconductor substrate comprising a transistor having a gate and a source/drain region, a first oxide layer covering the whole semiconductor substrate, and a poly-via penetrating through the first oxide layer to electrically connect the source/drain region is provided, comprising:

forming and patterning a poly-silicon layer to cover the whole poly-via and a part of the first oxide layer;

forming a hemispherical grain silicon layer over the substrate;

forming a first spacer on the hemispherical grain silicon layer on a side wall of the poly-silicon layer;

removing the hemispherical grain silicon on the oxide layer and a part of the poly-silicon layer by using the first spacer as a mask, so that the poly-silicon layer having a lower surface level than the first spacer;

forming a second spacer to embrace the first spacer, so that a part of the poly-silicon layer is covered by the second spacer;

removing a part of the exposed poly-silicon layer by using the first and second spacers as a mask to form a bottom electrode;

removing the first spacer and the second spacer; forming a dielectric layer to cover the bottom electrode; and forming a top electrode on the dielectric layer.

8. A method according to claim 7, wherein the poly-via comprises a plug.

9. A method according to claim 7, wherein the first spacer comprises an oxide layer.

10. A method according to claim 7, wherein the second spacer comprises an oxide layer.

11. A method according to claim 9 or 10, wherein the first and the second spacers are removed by wet etching using hydrogen fluoride to dip.

12. A method according to claim 7, wherein the top electrode comprises a poly-silicon layer.

13. A method of fabricating a stack capacitor, wherein a semiconductor substrate comprising a transistor having a gate and a source/drain region, a first oxide layer covering the whole semiconductor substrate, and a poly-via penetrating through the first oxide layer to electrically connect the source/drain region is provided, comprising:

forming and patterning a first poly-silicon layer to cover the whole poly-via and a part of the first oxide layer;

forming a first spacer a side wall of the first poly-silicon layer;

removing a part of the poly-silicon layer by using the first spacer as a mask, so that the first poly-silicon layer having a lower surface level than the first spacer;

forming a second spacer to embrace the first spacer, so that a part of the first poly-silicon layer is covered by the second spacer;

removing a part of the exposed first poly-silicon layer by using the first and second spacers as a mask;

forming a third spacer on an inner part of the second spacer, so that a part of the first poly-silicon layer is covered by the third spacer;

forming and etching back a second poly-silicon layer to form a poly-silicon column on the exposed first poly-silicon layer, so that the poly-silicon column and the first poly-silicon layer are combined as a bottom electrode;

removing the first spacer, the second spacer, and the third spacer;

forming a dielectric layer to cover the bottom electrode; and forming a top electrode on the dielectric layer.

14. A method according to claim 13, wherein the posy-via comprises a plug.

15. A method according to claim 13, wherein the first spacer comprises an oxide layer.

16. A method according to claim 13, wherein the second spacer comprises an oxide layer.

17. A method according to claim 13, wherein the third spacer comprises an oxide layer.

18. A method according to claim 15, 16 or 17, wherein the first, the second, and the third spacers are removed by wet etching using hydrogen fluoride to dip.

19. The method according to claim 13, wherein the top electrode includes a poly-silicon layer.

20. A method of fabricate a stack capacitor, wherein a semiconductor substrate comprising a transistor having a gate and a source/drain region, a first oxide layer covering the whole semiconductor substrate, and a poly-via penetrating through the first oxide layer to electrically connect the source/drain region is provided, comprising:

forming and patterning a first poly-silicon layer to cover the whole poly-via and a part of the first oxide layer;

forming a hemispherical grain silicon layer over the substrate;

forming a first spacer on the hemispherical grain silicon layer on a side wall of the first poly-silicon layer;

removing the hemispherical grain silicon on the oxide layer and a part of the first poly-silicon layer by using the first spacer as a mask, so that the first poly-silicon layer having a lower surface level than the first spacer;

forming a second spacer to embrace the first spacer, so that a part of the first poly-silicon layer is covered by the second spacer;

removing a part of the. exposed first poly-silicon layer by using the first and second spacers as a mask;

forming a third spacer on an inner part of the second spacer, so that a part of the first poly-silicon layer is covered by the third spacer;

forming and etching a second poly-silicon layer to form a poly-silicon column on the exposed first poly-silicon layer, so that the poly-silicon column and the first poly-silicon layer are combined as a bottom electrode;

removing the first spacer, the second spacer, and the third spacer;

forming a dielectric layer to cover the bottom electrode; and forming a top electrode on the dielectric layer.

21. A method according to claim 20, wherein the poly-via comprises a plug.

22. A method according to claim 20, wherein the first spacer comprises an oxide layer.

23. A method according to claim 20, wherein the second spacer comprises an oxide layer.

24. A method according to claim 20, wherein the third spacer comprises an oxide layer.

25. A method according to claim 22, 23, or 24, wherein the first, the second, and the third spacers are removed by wet etching using hydrogen fluoride to dip.

26. A method according to claim 20, wherein the top electrode a poly-silicon layer.

* * * * *